United States Patent
Solovyov

(10) Patent No.: US 11,289,640 B2
(45) Date of Patent: Mar. 29, 2022

(54) SECOND GENERATION SUPERCONDUCTING FILAMENTS AND CABLE

(71) Applicant: Brookhaven Technology Group, Inc., Stony Brook, NY (US)

(72) Inventor: Vyacheslav Solovyov, Rocky Point, NY (US)

(73) Assignee: Brookhaven Technology Group, Inc., Stony Brook, NY (US)

(*) Notice: Subject to any disclaimer, the term of this patent is extended or adjusted under 35 U.S.C. 154(b) by 492 days.

(21) Appl. No.: 16/071,772

(22) PCT Filed: Jan. 20, 2017

(86) PCT No.: PCT/US2017/014242
§ 371 (c)(1),
(2) Date: Jul. 20, 2018

(87) PCT Pub. No.: WO2017/151233
PCT Pub. Date: Sep. 8, 2017

(65) Prior Publication Data
US 2019/0131512 A1    May 2, 2019

Related U.S. Application Data

(60) Provisional application No. 62/281,264, filed on Jan. 21, 2016.

(51) Int. Cl.
*H01L 39/24* (2006.01)
*H01L 39/14* (2006.01)
*H01B 12/06* (2006.01)

(52) U.S. Cl.
CPC .......... *H01L 39/248* (2013.01); *H01B 12/06* (2013.01); *H01L 39/143* (2013.01)

(58) Field of Classification Search
CPC ...................................... H01L 39/248
See application file for complete search history.

(56) References Cited

U.S. PATENT DOCUMENTS 5,106,825 A * 4/1992 Mandigo .............. H01L 39/248
174/125.1
5,149,681 A    9/1992 Ohkawa
(Continued)

FOREIGN PATENT DOCUMENTS

| GB | 1288203 | 9/1972 |
|---|---|---|
| GB | 2498961 A | 8/2013 |
| JP | 8264039 | 10/1996 |

OTHER PUBLICATIONS

Van der Laan et al., Delamination Strength of YBCO Coated Conductors under Transverse Tensile Strength, Superconduct. Sci. Technol. 20, Jun. 21, 2007.
(Continued)

*Primary Examiner* — Paul A Wartalowicz
(74) *Attorney, Agent, or Firm* — Schroeder Law PC

(57) ABSTRACT

A high-temperature superconducting filament and cable, and a method for manufacturing same. The substrate used to grow the superconducting layer is removed, and the exfoliated superconducting layer is coated with a protective layer, and then sliced into narrow strips. The strips are thereafter encapsulated with a conductive metal to provide a high-temperature superconducting filament. The filaments may be bundled together to provide a high-temperature superconducting cable.

11 Claims, 7 Drawing Sheets

(56) References Cited

U.S. PATENT DOCUMENTS

| | | | |
|---|---|---|---|
| 5,164,361 A * | 11/1992 | Aprigliano | H01L 39/248 219/121.64 |
| 6,444,917 B1 * | 9/2002 | Scudiere | H01L 39/248 174/125.1 |
| 6,828,507 B1 | 12/2004 | Fritzemeier | |
| 7,071,148 B1 | 7/2006 | Selvamanickam | |
| 7,816,303 B2 | 10/2010 | Thieme | |
| 8,044,752 B2 | 10/2011 | Otto | |
| 8,437,819 B2 | 5/2013 | Takayasu | |
| 8,731,629 B2 | 5/2014 | King | |
| 2005/0009981 A1 | 1/2005 | Chen | |
| 2006/0073979 A1 * | 4/2006 | Thieme | H01L 39/248 505/434 |
| 2008/0020304 A1 | 1/2008 | Schroder | |
| 2008/0075927 A1 * | 3/2008 | Sakashita | H01L 39/2422 428/172 |
| 2008/0180202 A1 | 7/2008 | Otto | |
| 2008/0207458 A1 * | 8/2008 | Hong | H01F 6/06 505/238 |
| 2008/0236743 A1 | 10/2008 | Kye | |
| 2009/0087234 A1 | 4/2009 | Roof | |
| 2009/0233800 A1 | 9/2009 | Huang | |
| 2009/0298696 A1 | 12/2009 | Otto | |
| 2010/0022396 A1 | 1/2010 | Otto | |
| 2010/0184604 A1 | 7/2010 | Roden | |
| 2012/0211475 A1 | 8/2012 | Oswald | |
| 2012/0214675 A1 | 8/2012 | van der Laan | |
| 2014/0155269 A1 | 6/2014 | Daibo | |
| 2015/0248952 A1 * | 9/2015 | Ko | H01L 39/248 505/510 |
| 2015/0251227 A1 | 9/2015 | Koelmel | |
| 2016/0027555 A1 | 1/2016 | Nagasu | |

OTHER PUBLICATIONS

Floegel-Delor et al., Operation and Experience of a 2 km Coated Conductor REEL-to-REEL Copper Pulse Plating Facility, Journel of Physics: Conference Series, 2014.

Maeda et al., Recent Developments in High-Temperature Superconducting Magnet Technology (Review), ISEE Transactions on Applied Superconductivity, vol. 40, No. 3, Jun. 2014.

* cited by examiner

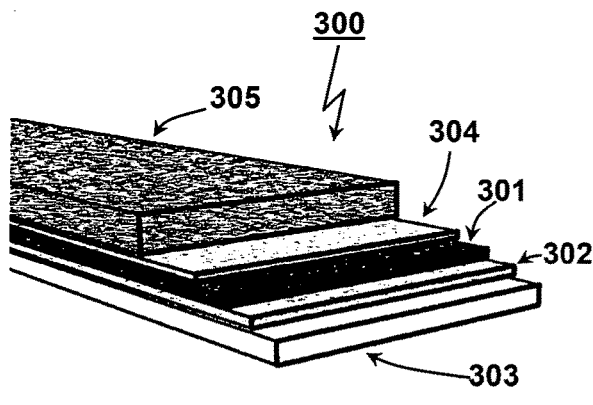
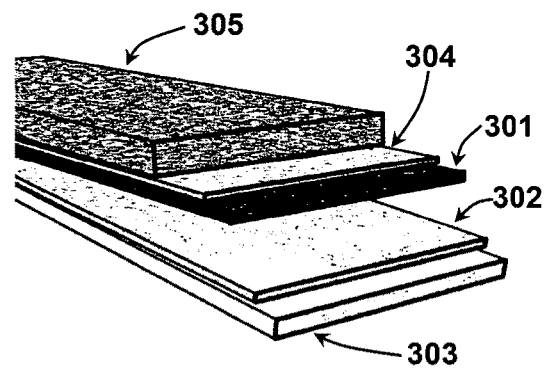
FIG. 3
FIG. 4
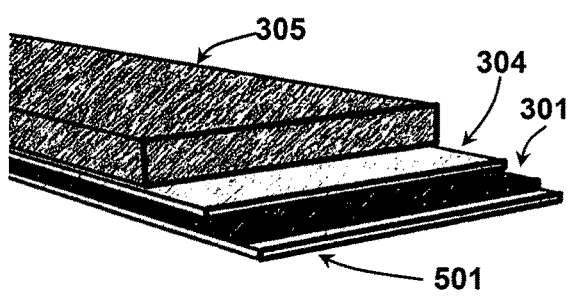
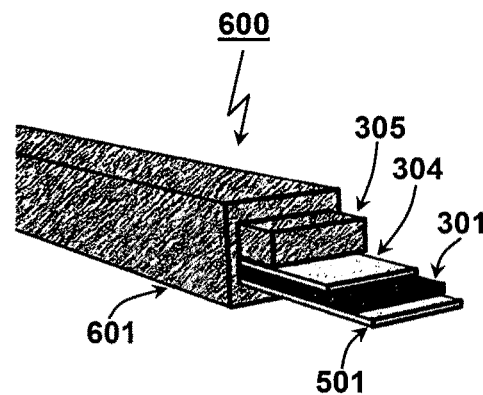
FIG. 5
FIG. 6

SECOND GENERATION SUPERCONDUCTING FILAMENTS AND CABLE

This invention was made with government support under Contract No. DE-SC0013856 awarded by the Department of Energy. The government has certain rights in the invention.

BACKGROUND OF THE INVENTION

The present invention relates to high-temperature superconducting yttrium-barium-copper-oxide filaments and cable, and to a process for manufacturing same via the exfoliation of a superconducting layer from an epitaxial substrate.

The advent of second generation (2G) $YBa_2Cu_3O_7$ (YBCO) wire technology has spawned impressive technological progress since the first meter of 2G wire was manufactured in 1995. Further developments in the field have been driven by existing and emerging applications, such as fault current limiters, transformers, and wind turbines. The second generation superconducting (2G) wires have record high upper critical field and critical temperature, potentially enabling design of high-temperature superconducting magnets, which could be cooled with inexpensive single-stage cryocoolers. The core 2G wire technology can be described as a thin (<2 micron) YBCO layer deposited on a 50-100 micron thick metal substrate. FIG. 1 shows the construction of a commercially-available RABiTS-based 2G wire (product of AMSC Corp. marketed as Amperium wire), referred to herein as tape 100. Tape 100 includes an approximately 100 micron thick metal substrate 103. Substrate 103 is coated with an oxide buffer 102, which is formed from a sequence of layers of various oxides, for example yttrium oxide, yttrium-zirconium oxide and cerium oxide. Oxide buffer 102 is typically deposited by a vacuum deposition method, such as reactive sputtering or electron beam evaporation. A layer of yttrium barium copper oxide superconductor Y—$ReBa_2Cu_3O_{7-x}$ (YBCO), referred to herein as superconducting layer 101, is grown on oxide buffer 102. In this commercially-available product, Re is a rare-earth metal, such as Dy, Gd, Nd, and x is the oxygen index, with x<1. A protective silver layer 104 is deposited on top of superconducting layer 101 by magnetron sputtering. Finally, tape 100 is solder-plated with opposing top and bottom metal foils, forming stabilizing layers 105 and 107, respectively. The stabilizing layers 105, 107 are 1-2 mm wider than the remainder of the tape, so a pair of opposing solder fillets 106 are formed in order to join the two stabilizer foils.

Commercially-available 2G wires, such as the wire shown in FIG. 1, are often delivered as high-aspect ratio tapes with the wide side being on the order of 4-12 mm and the thickness being on the order of 100-150 microns, whereas the thickness of superconducting layer 101 is on the order of 1-2 microns. The architecture associated with known commercially-available wires presents a number of problems, particularly when this architecture is used in magnet applications:

i) The high aspect ratio (≈1:1000) contributes to the magnetization (AC) losses, which can be as great as 10's of J/m of wire. This limits commercial application of the wire to low-field 77 K devices.

ii) The superconducting layer 101 is insufficiently stabilized because only the top surface of superconducting layer 101 has a good electrical pathway to the exterior of tape 100. In contrast, the bottom surface of superconducting layer 101 is in contact with the insulating oxide buffer 102. As a result, the stabilizing layer adjacent to the substrate, namely stabilizing layer 107, experiences substantially less current flow than that experienced by top stabilizer layer 105. This asymmetric nature of the conductor architecture contributes to the non-uniform conductor heating during a quench, which is known to causes de-lamination of the superconducting layer, and subsequent failure.

iii) Tape 100 exhibits highly anisotropic mechanical properties. Commercially-available 2G wires are exceptionally strong in the direction along the tape, the tensile axial yield strength being approximately 500-600 MPa. However the c-axis pull (transverse) strength is ≈10 times lower and the cleavage strength is almost negligible (<1 MPa). This is due, at least in part, to the poor adhesion between superconducting layer 101 and oxide buffer 102. The unpredictable separation of the superconducting layer from the oxide buffer, even under very moderate stress (<10 MPa), has been identified as the source of several magnet failures.

iv) A 2G tape, such as that shown in FIG. 1, allows only for pancake-type windings. Assembling a solenoid magnet from pancakes requires labor-intensive splicing of the individual pancakes via diagonal splices.

v) The architecture of a 2G tape does not allow for a simple splicing of a multi-strand cable. The interface between YBCO layer 101 and top stabilizer layer 105 has a typical resistance of less than 50 n$\Omega$/cm². However, the resistance between YBCO layer 101 and bottom stabilizer 107 is on the order of 100 μ$\Omega$/cm². Therefore, the manufacture of a multi-strand cable requires an elaborate splicing procedure that ensures that only top stabilizer surfaces are in contact with each other.

The current design of 2G wire magnets can be described as a flat "pancake" stack. FIG. 2 shows a typical design of a simple solenoid 200. Each pancake of the stack is formed from winding a 2G tape such as tape 100 about an axis T. Tape 100 is orientated such that stabilizing layers 105 and 107 define the inner and outer radial surfaces of the stack when viewed in FIG. 2. For example, radial surface 206 is defined by either stabilizing layer 105 or stabilizing layer 107 of a length of tape 100. The individually-formed pancakes are thereafter spliced together (via diagonal splicing) to provide electrical conductivity through the entire solenoid. The magnetic field generated by solenoid 200 is comprised of two components, one parallel to the height h of the pancake stack, i.e., component 201, and one perpendicular to the height h of the pancake stack, i.e., component 202. In this design, the outer pancakes 203 and 205 experience a greater normal magnetic field component than the inner pancakes, e.g., pancake 204, and therefore generate the highest AC loss. The lost energy is dissipated as heat in the winding. Since the specific heat and the coefficient of thermal conductivity of most materials become very low at cryogenic temperatures (due to the phonon freeze-out), even relatively small amount of heat can cause a significant temperature rise. During a very slow ramp of the magnet (several hours), the temperature of pancakes 203 and 205 can rise over the critical temperature of the superconductor, causing the failure of the magnet. Thus, the ramping rate of the magnet is often limited by the overheating of the outer pancakes. In many applications, it is desirable to minimize the ramping loss, such that the ramping rate can be safely increased.

There is therefore a need in the art for high-temperature superconducting filaments which can be used, for example, to manufacture superconducting magnets with reduced/eliminated risk of delamination of the superconducting layer, without the need to utilize discreet pancakes and diagonal splicing, and with enhanced mechanical properties. There is a further need in the art for a high-temperature superconducting cable which can be used for power transmission with reduced magnetization losses. There is a still further need in the art for a fault current limiter utilizing superconducting materials which exhibits reduced magnetization losses. Finally, there is a need in the art for a method of manufacturing high-temperature superconducting filaments and cables with reduced/eliminated risk of delamination of the superconducting layer, which exhibit more uniform electrical properties, which exhibit enhanced mechanical properties, and which may be readily spliced together.

SUMMARY OF THE INVENTION

The present invention, which addresses the needs of the art, relates to a method for manufacturing high-temperature superconducting filaments from a 2G wire. The 2G wire includes a superconducting layer positioned upon a metal substrate. The method includes the step of separating the superconducting layer from the metal substrate, thereby providing an exfoliated superconducting tape. The exfoliated superconducting tape is thereafter sliced into narrow strips. The narrow strips are then encapsulated to provide the high-temperature superconducting filaments. In one preferred embodiment, the exfoliated superconducting tape is coated with a protective layer prior to the slicing of the tape into the narrow strips. In another preferred embodiment, the narrow strips are encapsulated with an electrically-conductive material, e.g., via i) soldering of a metal stabilizer thereabout, or ii) galvanically electroplating a conductive metal (e.g., copper) thereabout. In still another embodiment, lengths of the exfoliated superconducting tape are stacked prior to the slicing of the tape into the narrow strips, thereby providing multi-ply strips including multiple conductors. A metal stabilizer layer may be positioned between adjacent lengths of the stacked exfoliated superconducting tape. In one preferred embodiment, the individual filaments are spliced together to provide an extended length of continuous filament. In certain embodiments, the length of the superconducting filament is greater than 100 meters and the width is between 1-2 mm. In still other embodiments, the exfoliation is accomplished by rapidly heating the substrate with an inductive coil. In still other embodiments, the exfoliation is accomplished by deformation of the tape before the exfoliation. In still other embodiments, the exfoliation is accomplished by irradiation of the tape with energetic ions.

The present invention further relates to a method for manufacturing a length of high-temperature superconducting cable from a 2G wire. The 2G wire includes a superconducting layer positioned upon a metal substrate. The method includes the step of separating the superconducting layer from the metal substrate, thereby providing an exfoliated superconducting tape. The exfoliated superconducting tape is thereafter sliced into narrow strips. The narrow strips are then encapsulated to provide the high-temperature superconducting filaments. In one preferred embodiment, the exfoliated superconducting tape is coated with a protective layer prior to the slicing of the tape into the narrow strips. In another preferred embodiment, the narrow strips are encapsulated with an electrically-conductive material, e.g., via i) soldering of a metal stabilizer thereabout, or ii) galvanically electroplating a conductive metal (e.g., copper) thereabout. In still another embodiment, lengths of the exfoliated superconducting tape are stacked prior to the slicing of the tape into the narrow strips, thereby providing multi-ply strips including multiple conductors. A metal stabilizer layer may be positioned between adjacent lengths of the stacked exfoliated superconducting tape. The high-temperature superconducting filaments are thereafter bundled into a superconducting cable. In one preferred embodiment, the individual filaments are spliced together to provide an extended length of continuous filament. In another preferred embodiment, the superconducting cable is wrapped with a conductive metal tape to protect the filaments and to provide additional quench stability. In certain embodiments, the length of the superconducting cable is greater than 100 meters and the width is between 1-2 mm. In still other embodiments, the filaments are twisted in order to reduce the magnetization loss of the cable. In still other embodiments, the number of filaments is between 1 and 100. In still other embodiments, the exfoliation is accomplished by rapidly heating the substrate with an inductive coil. In still other embodiments, the exfoliation is accomplished by deformation of the tape before the exfoliation. In still other embodiments, the exfoliation is accomplished by irradiation of the tape with energetic ions. In still other embodiments, the filaments are transposed to reduce the electrical loss of the cable.

The present invention further relates to a high-temperature superconducting filament. The filament includes a superconducting layer having a protective coating substantially covering each surface thereof. The filament further includes at least one metallic stabilizing layer adhered thereto. The filament is encapsulated within an electrically-conductive material. Finally, the filament is encapsulated in the absence of a buffer layer and in the absence of a superconductor substrate layer whereby both surfaces of the superconducting layer are in substantially equal electrical conduct with the electrically-conductive material surrounding the superconductor. In one preferred embodiment, the filament is encapsulated in the absence of a ferromagnetic material or layer. In another preferred embodiment, the electrically-conductive material is a metal stabilizer soldered about the exterior thereof. In another preferred embodiment, the electrically-conductive material is a conductive metal galvanically electroplated about the exterior thereof. In still another embodiment, the filament includes multiple stacked superconductors. In another embodiment, the filament includes multiple stacked superconductors having a metal stabilizer layer positioned between adjacent stacks. In certain embodiments, the length of the superconducting filament is greater than 100 meters and the width is between 1-2 mm.

The present invention further relates to a high-temperature superconducting cable. The cable includes a plurality of twisted filaments. Each of the filaments includes a superconducting layer having a protective coating substantially covering each surface thereof. The filament further includes at least one metallic stabilizing layer adhered thereto. The filament is encapsulated within an electrically-conductive material. Finally, the filament is encapsulated in the absence of a buffer layer and in the absence of a superconductor substrate layer whereby both surfaces of the superconducting layer are in substantially equal electrical conduct with the electrically-conductive material surrounding the superconductor. In one preferred embodiment, the filament is encapsulated in the absence of a ferromagnetic material or layer. In another preferred embodiment, the electrically-conductive material is a metal stabilizer soldered about the exterior thereof. In another preferred embodiment, the electrically-conductive material is a conductive metal galvanically electroplated about the exterior thereof. In still another embodiment, the filament includes multiple stacked superconductors. In another embodiment, the filament includes multiple stacked superconductors having a metal stabilizer layer positioned between adjacent stacks. In one preferred embodiment, the cable further includes a protective metallic tape wrapped thereabout. In certain embodiments, the length of the superconducting cable is greater than 100 meters and the width is between 1-2 mm. In still other embodiments, the filaments are twisted in order to reduce the magnetization loss of the cable. In still other embodiments, the number of filaments is between 1 and 100. In still other embodiments, the filaments are transposed to reduce the electrical loss of the cable.

Additional features, advantages, and embodiments of the present invention may be set forth from consideration of the following detailed description, drawings, and claims. Moreover, it is to be understood that both the foregoing summary of the present disclosure and the following detailed description are exemplary and intended to provide further explanation without limiting the scope of the present disclosure claimed.

BRIEF DESCRIPTION OF THE DRAWINGS

FIG. 3 is an illustrative view of a 2G wire without a bottom stabilizing layer.

FIG. 4 is an illustration showing the 2G wire of FIG. 3 during an exfoliation process.

FIG. 5 is a view showing the wire of FIG. 4 after the exfoliation of the substrate and after the deposition of a protective silver layer.

FIG. 6 is a view showing the wire of FIG. 5 after encapsulating with a stabilizing layer.

DETAILED DESCRIPTION OF THE INVENTION

Figure 1:
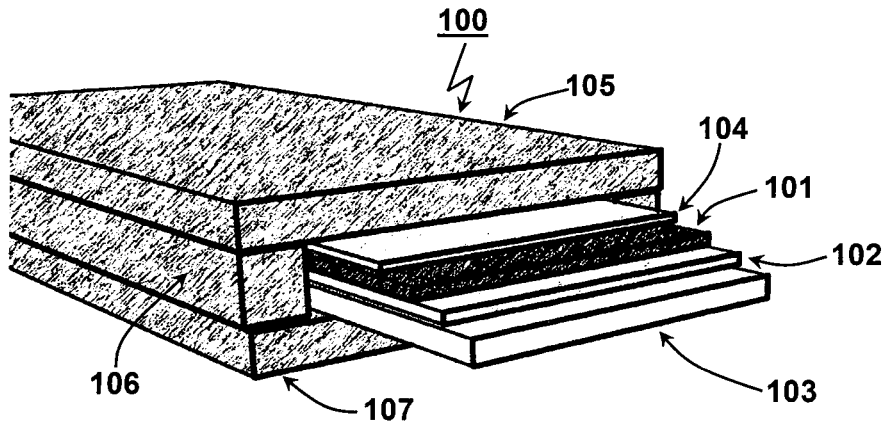
FIG. 1 is an illustrative view of the epitaxial layers in a commercially-available 2G wire.
Figure 2:
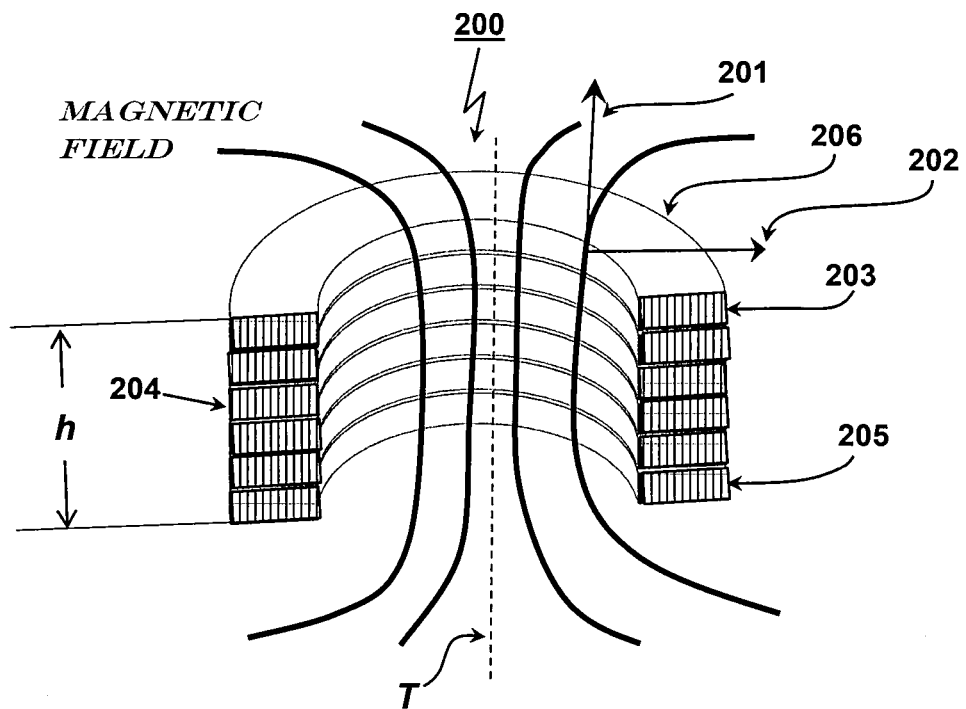
FIG. 2 is a cross-sectional view of a typical superconducting solenoid formed of stacked pancake coils.

A second generation (2G) tape, i.e., tape 300, is shown in FIG. 3. Tape 300 is preferably on the order of 100-1000 meters long and 1-100 mm wide. Tape 300 includes a metal substrate 303, a buffer layer 302, a superconducting layer 301, a silver protective coating 304, and a stabilizing metal layer 305. The stabilizer layer 305 can be made of copper, stainless steel, bonze or another conductive metal. In a preferred embodiment, the tape is subjected to an external action, which increases the stress level between the superconducting layer 301 and the buffer layer 302. This external action can be accomplished by, for example, rapid heating by an external source, such as an inductive coil or infrared radiation. The external action can also be accomplished by a mechanical deformation of the tape, such as bending. The stress level is preferably raised to a level where the substrate 303 and the buffer layer 302 can be mechanically separated from the superconducting layer 301 without damaging the latter in a process referred to as exfoliation. FIG. 4 illustrates the exfoliation process where the substrate 303 and the buffer layer 302 are separated from the rest of the tape. After the exfoliation, the exposed YBCO surface is preferably coated with a protective layer, e.g., silver layer 501, as shown in FIG. 5. After the protective layer is applied, the tape is sliced into narrow strips by, for example, laser cutting, and the narrow strips are then encapsulated by, for example, plating with a conductive metal such as copper to provide a filament. FIG. 6 illustrates a filament 600 formed from the encapsulation of the narrow strip of FIG. 5 with a stabilizing copper layer 601. The high-temperature superconducting filaments may then be bundled to form a superconducting cable.

The substrate 303 may include texture that is inherited by the buffer layer 302 and the superconducting layer 301. The texture describes a microstructure of the superconducting layer 301, including crystal plane alignment. The aligned superconducting layer 301 has a critical current density much higher than a polycrystalline (non-textured) superconductor. The textured substrate may be a flexible metal film or one of the other layers described above.

The substrate may be produced by a variety of processes. In one embodiment, the substrate is manufactured by a so-called rolling-assisted biaxially textured substrate (RABiTS) process. The RABiTS-coated conductor substrate is comprised of textured Ni or other Ni-alloy metal tape coated with an oxide buffer.

In another embodiment, the substrate may be produced by a process known as ion-beam assisted deposition (IBAD). The IBAD coated conductor is comprised of a non-textured metal film substrate, a sequence of oxide buffer layers, a superconductor layer, and a metallic stabilizer layer.

It is understood that other methods or materials can be used to construct similar tapes, and that they can also be used in accordance with this invention.

The superconducting layer, formed of YBCO or Bi-based HTS materials, may be deposited by any known process. According to one embodiment, the superconducting layer may be deposited by pulsed laser deposition. According to another embodiment, the superconducting layer may be deposited by metal-organic chemical vapor deposition (MOCVD). In another embodiment, the superconducting layer is deposited by metal-organic deposition (MOD). The superconducting layer may have any thickness, but is typically less than 10 microns.

A protective metal 501 layer may be deposited over the superconductor layer of the superconducting tape for the purposes of protecting the superconductor layer and providing a path for the electrical current if the superconductor becomes locally resistive due to overheating or spontaneous loss of superconductivity. The superconducting layer in the resistive state has the specific electrical resistivity of 300 $\mu\Omega$*cm. If the electrical current is allowed to flow through the resistive part of the superconducting layer, the heat dissipation will most likely result in a catastrophic destruction of the conductor. Copper or silver have a specific electrical resistivity of approximately 2 $\mu\Omega$*cm, which allows for safe diversion of the electrical current away from the resistive part of the superconductor. The protective metal layer may be any suitable metal alloy. According to one embodiment, the protective metal layer is a silver layer deposited by magnetron sputtering.

A stabilizer layer may be deposited over the protective metal layer. In one embodiment, the stabilizer layer may be a copper foil soldered to the silver coating by a low-temperature solder. The foil thickness is preferably greater than 25 microns. In another embodiment, the stabilizer is deposited by electroplating. FIG. 6 shows a YBCO strip encapsulated by stabilizer layer 601, stabilizer layer 601 having been deposited by electroplating.

The superconducting layer may be formed of any appropriate superconductor. According to one embodiment, the superconductor layer may be a rare earth metal-alkaline earth metal-transition metal-oxide superconductor.

Figure 7:
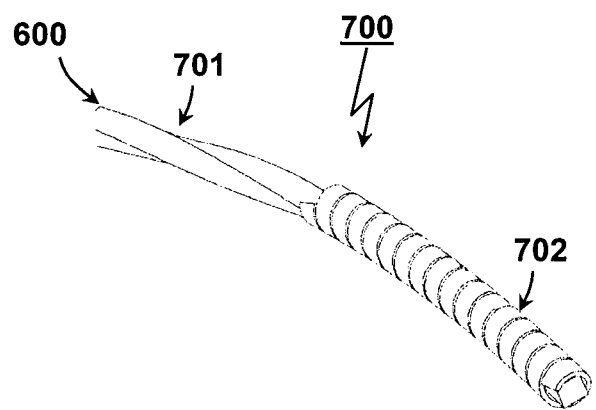
FIG. 7 is a view of a cable formed of twisted filaments formed in accordance with the present invention.

In one embodiment, the encapsulated filaments of the present invention are bundled together with strips of conductive metal, such as copper, in order to form a composite cable. An example of such a cable, i.e., cable 700, is shown in FIG. 7. Cable 700 is formed by twisting filaments 600 into a bundle 701, and then wrapping bundle 701 with a protective metallic tape 702.

In another embodiment, a stabilizing copper layer is deposited on the narrow strip by a galvanic process. The metal layer is deposited by passing the narrow strip through an electroplating bath filled with either basic or acidic copper solution. In a preferred embodiment, the deposited copper thickness is greater than 10 microns.

The increased critical current properties of the present filaments/cables makes such filaments/cables particularly suitable for applications involving high current density wherein reduced AC loss is desired. The filaments/cable may be used in fast-ramping superconducting magnets, generators, and transformers.

In one embodiment, the present invention provides a superconducting magnet. The magnet includes an extended length of continuous filament wound into a preselected configuration to provide a solenoid. It will be appreciated by those skilled in the art that an extended length of continuous filament eliminates the need to form discreet pancakes, and the further need to electrically splice such pancakes together. Due to narrow width of the filament, the magnet has proportionally lower magnetization loss, resulting in reduced loss of coolant, for example liquid Helium, during the magnet charge and discharge.

In another embodiment, the present invention provides an electrical transmission cable. The transmission cable includes a plurality of bundled filaments. The layers of the filaments preferably exclude all ferromagnetic materials. The superconducting layer is preferably stabilized with a high resistance metal. It will be appreciated by those skilled in the art that the elimination of any ferromagnetic layers within the filament will reduce the losses associated with magnetization of the ferromagnetic layers during transmission of power, thus providing increased efficiency and cost savings.

In a further embodiment, the present invention provides a fault current limiter for an electrical grid. The fault current limiter includes filaments wherein the superconducting layer is preferably stabilized with a high resistance metal. The filaments are preferably sliced and twisted to reduce magnetization, and the losses associated therewith. The filaments preferably do not contain any ferromagnetic material, which eliminates losses due to the magnetization of the device by the AC current during operation.

In the accompanying detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present invention, as generally described herein, and illustrated in the figures, can be arranged, substituted, combined, and designed in a wide variety of different configurations, all of which are explicitly contemplated and made part of this disclosure.

EXAMPLES

Example 1

Figure 8:
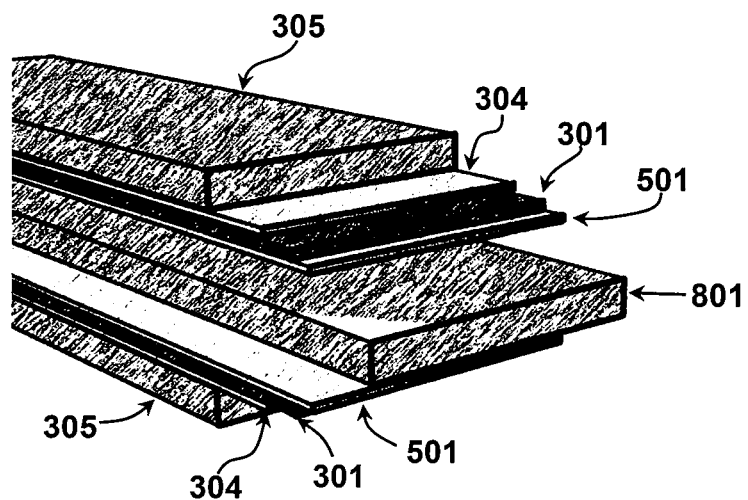
FIG. 8 is a view of a two-ply tape formed from the wire of FIG. 5 and an intermediate stabilizer.

A standard wire (8602-FCL) offered by the AMSC Corp was used for the exfoliation experiments. The wire was a 10 mm wide YBCO-RABiTS tape soldered between two 12 mm wide layers of 75 $\mu$m thick 316L stainless steel foil. The YBCO layer was exfoliated after mechanically trimming the side fillets of the tape. In order to facilitate the YBCO layer delamination, the tape was rapidly heated by an inductive coil coupled to the tape. The inductive coil included 8 turns of gauge 14 litz wire wound to conform to a 16 cm long and 1 cm wide race-track shape. The coil was placed directly under the tape, which ensured good coupling of the tape to the AC field created by the coil. The coil was energized for 1-2 seconds by applying approximately 200 W of AC power, 50 KHz. The YBCO layer was immediately exfoliated from the substrate. Lengths of tape approximately 10 cm long were exfoliated in a typical run. These lengths of tape were then sliced into 1 mm-4 mm coupons by a $CO_2$ laser. The laser was a Kern Mirco Laser system, which included a moving table and a 260 W $CO_2$ laser. The cutting was assisted by the flow of nitrogen gas. The laser was operated at 20% power and was able to cut the strips at approximately 1 inch per second. Two-ply test coupons of various widths were prepared by soldering two lengths of exfoliated superconducting tape to a 25 micron thick copper foil using a In95%-Ag5% soldering alloy. FIG. 8 is an illustration of the construction of this two-ply wire. Here, the two lengths of exfoliated superconducting tape are coated with a protective silver layer 501 and are bonded via an intermediate copper stabilizer 801, whereas a low-temperature soldering alloy, such as In—Ag is used as a bonding agent. The additional copper stabilizer improves the wire stability by providing an extra path for the electrical current in the event the superconducting layers 301 becomes resistive and the current needs to be diverted to the metal stabilizer.

Example 2

Figure 9A:
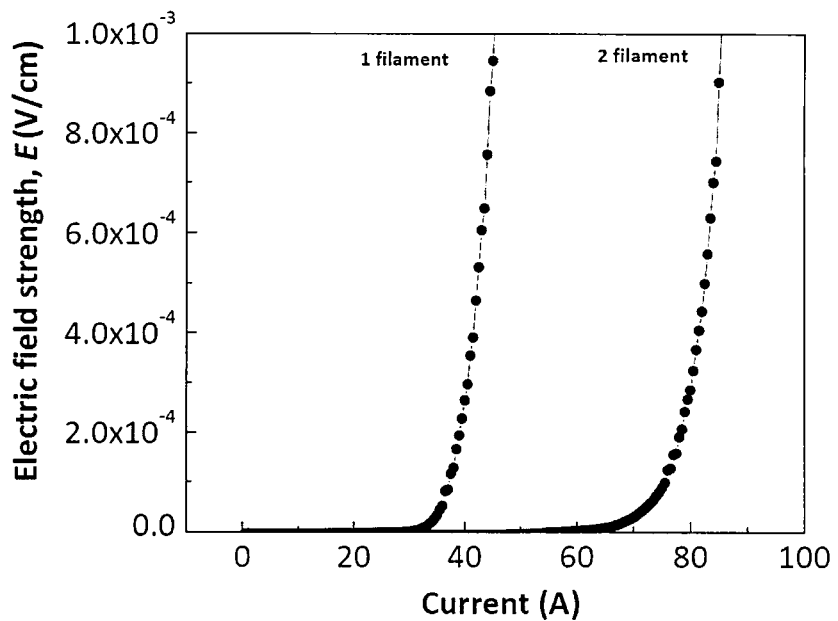
FIG. 9A is a graphical representation of the critical currents of a 1.5 mm wide one-ply wire coupon (single filament) and a 1.5 mm wide two-ply wire coupon (two filaments) at 77 K.
Figure 9B:
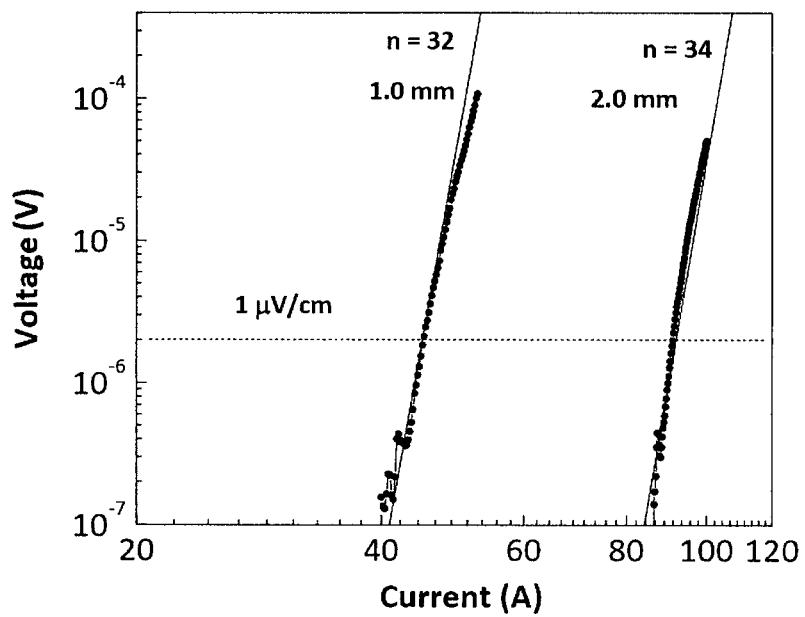
FIG. 9B is a graphical representation of the critical current densities of 1 mm wide and 2 mm wide wire coupons at 77 K.
Figure 9C:
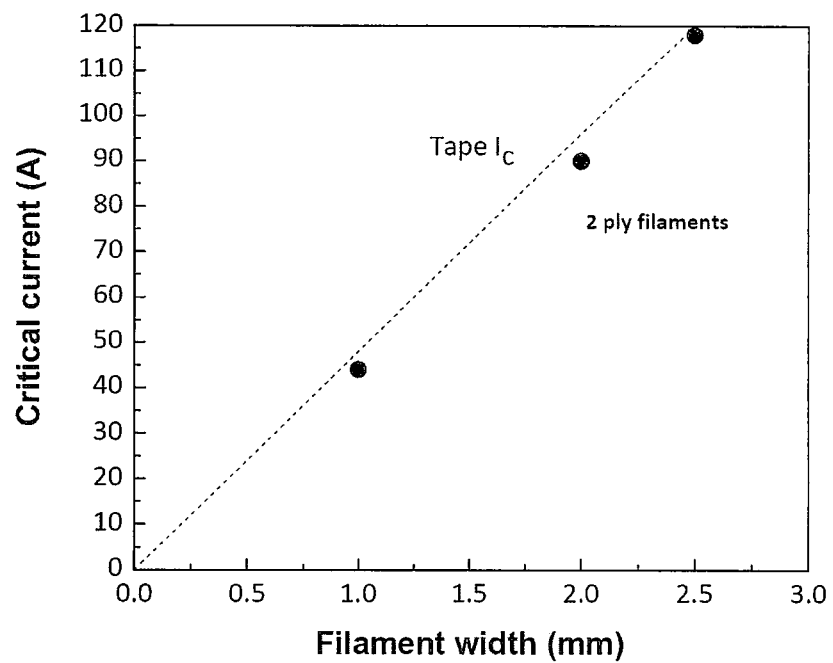
FIG. 9C is a graphical representation of the critical currents of 1 mm, 2 mm and 2.5 mm wide wire coupons as a function of the wire width, with the dashed line representing the critical current of the original wire.

The transport critical current of wire coupons prepared in accordance with Example 1 was measured at 77K as a function of the width of the strip. For the measurements, the strips were soldered to 10 mm wide, 50 micron thick copper current leads using a low-temperature indium-based solder. The voltage leads were 25 micron thick copper wires attached to the strips by the low-temperature solder. The wire coupons were mounted on a test fixture and the fixture was immersed in a liquid nitrogen bath. DC current was gradually increased and the voltage was recorded as a function of the current (I-V curve). FIG. 9A shows the critical currents for a 1.5 mm wide one-ply wire coupon (single filament) and for a 1.5 mm wide two-ply wire coSupon (two filaments) at 77 K. The test data demonstrates that the current capacity of a two-ply wire coupon (two filaments) is approximately double the current capacity of a one-ply wire coupon (single filament). FIG. 9B shows the I-V curves of 1 mm wide and 2 mm wide wire coupons at 77 K. The solid lines are the power approximations, $V \sim I^n$, where n is the so-called n-value exponent. The data demonstrates that the exfoliated strips retain the n-value of the original value, which is >20 for a typical sample. The critical current density of the wire coupons is summarized in FIG. 9C, where the dashed line represents the critical current density of the original wire. The data demonstrates that the wire coupons formed from the exfoliated strips retain the critical current down to 1 mm wide strips.

Example 3

Figure 10:
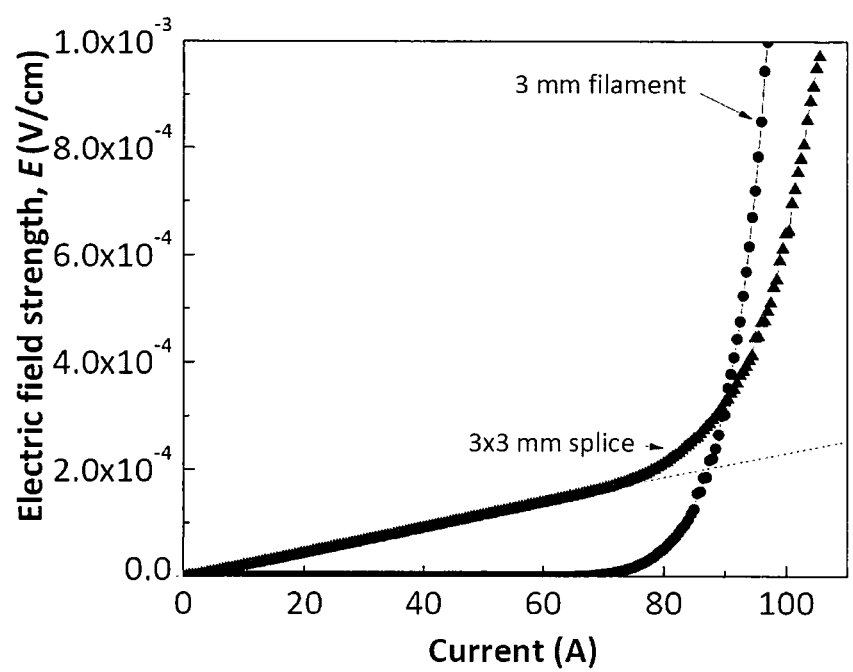
FIG. 10 is a graphical representation of the current-voltage curve of a 3 mm wide filament and of the same 3 mm wide filament after having been cut and spliced together. The dashed line represents 200 nΩ/cm² approximation.

The specific resistivity, defined as the resistance times the joint area, is an important parameter of a conductor. It is well known that the best results are achieved with two-component alloys, e.g., SnAg, InSn, SnPb, with RE123 pre-tinned or with an aluminum heater block to press the joint surfaces during the soldering process. In general, measured specific resistivity at 77 K ranges from >30 $n\Omega/cm^2$ to <500 $n\Omega/cm^2$. In order to determine the surface resistance of the exfoliated YBCO surface, a splice of 3 mm wide filaments was prepared by soldering the filaments face to face using Indium. The I-V curves of the filament and the splice were recorded at 77 K. FIG. 10 compares the I-V curves of a 3 mm wide filament and a 3 mm wide filament containing a single splice. The 3 mm wide filament was tested and the resultant data recorded in FIG. 10. The same 3 mm wide filament was then cut, spliced back together, and tested. The resistive part of the splice I-V curve was approximated with a linear function and the slope of the curve was used to determine the area resistance. The average splice resistance measured over 5 coupons was 190±20 $n\Omega/cm^2$.

Example 4

Figure 11:
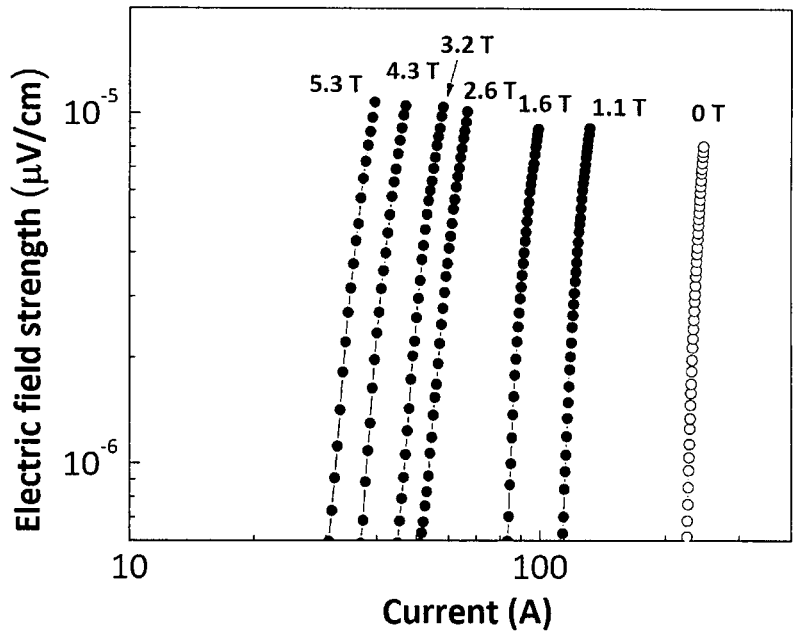
FIG. 11 is a graphical representation of the I-V curves of a 1 mm wide wire coupon at 4.2 K, with fields up to 5.3 T.
Figure 12:
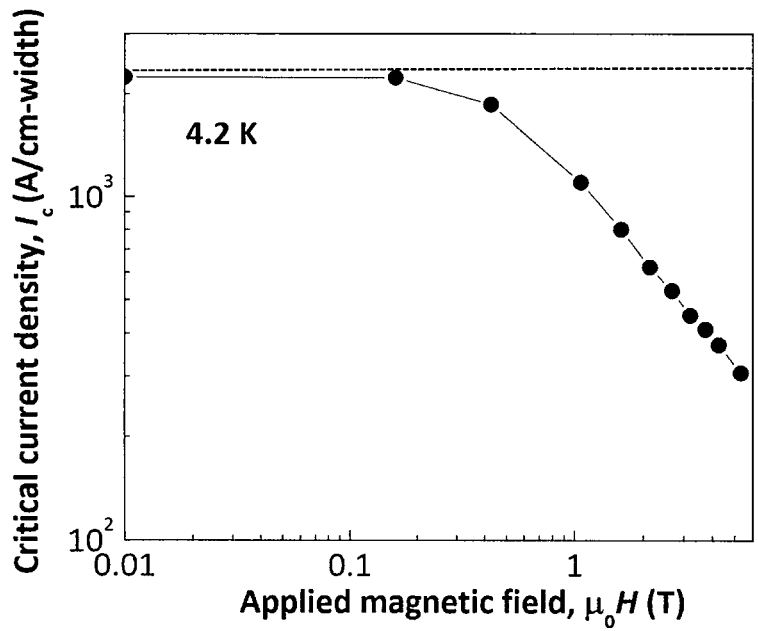
FIG. 12 is a graphical representation of the critical current density of a 1 mm wide wire coupon as a function of an applied magnetic field, 4.2 K, the field perpendicular to the broad side of the wire coupon.

FIGS. 11-12 depict the results of a 4.2 K (liquid helium) measurement. A single-ply wire coupon was mounted on a specially made G10 holder and placed inside an 8 T Nb—Ti magnet. The coupon was glued to the holder with GE varnish. The magnet was pre-cooled in a liquid nitrogen bath after the cryostat was filled with liquid Helium. The magnetic field was applied perpendicular to the broad side of the coupon (along c-axis of the YBCO layer). The I-V curves were recorded in DC 4-point mode; the maximum current was 300 A. FIG. 11 shows I-V curves of the coupon at 4.2 K, up to 5.3 tesla. FIG. 12 shows dependence of the critical current density of the coupon as a function of magnetic field. The zero-field critical current density of the original wire is shown as a horizontal dashed line. The coupon was tested at 4.3 K, DC current up to 300 A. The data shows that the critical current density of the wire is within 10% of the original tape.

What is claimed is:

1. A method for manufacturing a multi-ply high-temperature superconducting wire from a second generation wire, said second generation wire including a superconducting layer positioned upon a metal substrate, said second generation wire further including a buffer layer positioned between said superconducting layer and said metal substrate, the method comprising the steps of:
   a) separating said superconducting layer from said metal substrate to provide an exfoliated superconducting tape, said exfoliated superconducting tape including a superconducting layer in the absence of a buffer layer and a metal substrate;
   b) stacking lengths of said exfoliated superconducting tape; and
   c) laser slicing said stacked exfoliated superconducting tape into narrow strips to provide said multi-ply high-temperature superconducting wire, said multi-ply high-temperature superconducting wire having multiple superconducting layers.

2. The method according to claim 1, further comprising the step of encapsulating said strips.

3. The method according to claim 2, wherein said encapsulating step includes the step of encapsulating said strips with an electrically-conductive material.

4. The method according to claim 2, wherein said encapsulating step includes the step of soldering a metal stabilizer about said strips.

5. The method according to claim 2, wherein said encapsulating step includes the step of galvanically electroplating a conductive metal about said strips.

6. The method according to claim 1, further comprising the step of bundling a plurality of said multi-ply high-temperature superconducting wires.

7. The method according to claim 6, further comprising the step of twisting said multi-ply high-temperature superconducting wires.

8. The method according to claim 1, further comprising the step of positioning a metal stabilizer layer between adjacent strips.

9. The method according to claim 1, wherein said separating step includes the step of rapidly heating the substrate with an inductive coil.

10. The method according to claim 1, wherein said separating step includes the step of deforming said second generation wire.

11. The method according to claim 1, further comprising the step of coating said superconducting layer of said exfoliated superconducting tape with a protective layer prior to said slicing step, and wherein said protective layer is silver, and said protective layer is deposited by magnetron sputtering.

* * * * *